United States Patent
Kim

(10) Patent No.: US 7,014,715 B2
(45) Date of Patent: Mar. 21, 2006

(54) PHOTORESIST SUPPLY APPARATUS AND METHOD OF CONTROLLING THE OPERATION THEREOF

(75) Inventor: Yong-Kyung Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/942,128

(22) Filed: Sep. 16, 2004

(65) Prior Publication Data

US 2005/0069631 A1 Mar. 31, 2005

(30) Foreign Application Priority Data

Sep. 27, 2003 (KR) ............... 10-2003-0067135

(51) Int. Cl.
*B05C 11/10* (2006.01)
(52) U.S. Cl. ............... 118/697; 118/702; 118/703; 239/120; 222/55; 222/65; 222/64
(58) Field of Classification Search ............... 118/695, 118/696, 697, 699, 700, 701, 702, 703, 708; 239/112, 120, 407, 569; 222/55, 64, 65
See application file for complete search history.

(56) References Cited

U.S. PATENT DOCUMENTS

| | | | |
|---|---|---|---|
| 5,636,762 A * | 6/1997 | Juhola et al. | ............... 222/1 |
| 6,033,475 A | 3/2000 | Hasebe et al. | |
| 6,524,597 B1 | 2/2003 | Kashimoto | |
| 6,554,579 B1 * | 4/2003 | Martin et al. | ............... 417/53 |
| 2002/0050247 A1 * | 5/2002 | Sekiguchi et al. | ............... 118/694 |
| 2004/0067307 A1 * | 4/2004 | Lee et al. | ............... 427/240 |

* cited by examiner

*Primary Examiner*—George Koch
(74) *Attorney, Agent, or Firm*—Volentine Francos & Whitt, PLLC

(57) ABSTRACT

A photoresist supply apparatus of semiconductor coating equipment fills a supply pipe with new photoresist when a used photoresist bottle is replaced. The photoresist supply apparatus includes first and second photoresist bottles, first and second gas supply pipes connected to the bottles, first and second solenoid valves disposed along the gas supply pipes, first and second purge start buttons, first and second photoresist supply pipes, first and second trap tanks to which the supply pipes are connected, a third photoresist supply pipe connected to the trap tanks, a nozzle connected to the third photoresist supply pipe, first and second level sensors disposed at an upper level of the trap tanks, third and fourth level sensors disposed at a lower level of the trap tank, first and second discharge pipes connected to the trap tanks, third and fourth solenoid valves disposed along the discharge pipes, first and second drain sensors associated with the discharge pipes, and a controller.

14 Claims, 4 Drawing Sheets

PHOTORESIST SUPPLY APPARATUS AND METHOD OF CONTROLLING THE OPERATION THEREOF

BACKGROUND OF THE INVENTION

1. Field of the Invention

The present invention relates to semiconductor coating equipment. More particularly, the present invention relates to photoresist supply apparatus for dispensing photoresist onto a substrate such as a semiconductor wafer.

2. Description of the Related Art

The processes involved in the manufacturing of semiconductor devices can be generally classified as fabrication, assembly and test processes. The fabrication processes include supply, diffusion, photolithography, etching and thin film-forming processes. These processes are carried out selectively and repeatedly on a wafer to construct an electrical circuit on the wafer.

In the photolithography process, an oxide film is formed on the surface of a polished silicon wafer to protect a surface of the wafer, liquid photoresist is dispensed onto the oxide film, and then the wafer is rotated at a high speed to form a uniform coating of the photoresist on the wafer. Next, the wafer is selectively exposed so that a portion of the layer of photoresist undergoes a photo-chemical reaction, whereby a virtual image is transcribed onto the photoresist. Next, the photoresist is developed to form a pattern corresponding to the virtual image. Then, a thin film that exists below the patterned photoresist is etched by gas or chemicals, using the photoresist pattern as a mask, to in turn pattern the thin film. In this photolithography process the photoresist plays a very important role in the forming of the pattern. In particular, the precision of the line width and/or the CD (critical dimension) of the pattern depends on the thickness and uniformity of the layer of photoresist formed on the wafer.

A prior art apparatus for forming a uniform layer of photoresist on a wafer includes a storage tank for storing the photoresist, a dispensing tube for dispensing the photoresist onto a wafer, a supply line connecting the storage tank to the dispensing tube, a valve associated with the storage tank, and a main sensor installed adjacent the valve. The apparatus also includes an auxiliary sensor connected between the valve and the dispensing tube for sensing a residual amount of photoresist in the supply line. The auxiliary sensor is provided to prevent bubbles from being undesirably entrained in the photoresist when the main sensor is operating erroneously.

Also, an apparatus for forming a uniform layer of photoresist on a wafer is disclosed in U.S. Pat. No. 6,332,924 B1. This conventional photoresist supply apparatus is provided with a plurality of bottles containing the photoresist. When photoresist in one bottle is exhausted, the bottle is replaced. FIG. 1 illustrates this prior art photoresist supply apparatus.

The photoresist supply apparatus includes first and second photoresist bottles 10 and 30, first and second gas supply pipes 12 and 32, first and second gas supply valves 11 and 31, first and second photoresist supply pipes 14 and 34, first and second trap tanks 16 and 36, a third photoresist supply pipe 44, a nozzle 46, first and second level sensors 18 and 38, first and second discharge pipes 22 and 42, and first and second drain valves 20 and 40.

The first and second photoresist bottles 10 and 30 store the same type of photoresist solution.

The first and second gas supply pipes 12 and 32 are connected to the first and second photoresist bottles 10 and 30, respectively, to supply N2 purge gas to the bottles. The first and second gas supply valves 11 and 31 are installed in the first and second gas supply pipes 12 and 32. Each of the valves 11 and 31 can be switched between respective positions at which the N2 purge gas is supplied to or cut off from the respective bottle 10, 30.

The first and second photoresist supply pipes 14 and 34 are connected to upper parts of the first and second photoresist bottles 10 and 30, respectively, to supply photoresist solution. The first and second trap tanks 16, 36 are, in turn, connected to the first and second photoresist supply pipes 14 and 34 to receive photoresist supplied from the first and second photoresist bottles 10 and 30. The third photoresist supply pipe 44 is connected to the first and second trap tanks 16 and 36 to supply the photoresist from the first and second trap tanks 16 and 36 to the nozzle 46. The nozzle 46 sprays the photoresist, supplied through the third photoresist supply pipe 44, onto a wafer.

The first and second level sensors 18 and 38 are installed on the first and second trap tanks 16 and 36, respectively, to sense when the tanks 16 and 36 are low and hence, when the bottle 10 and 30 are empty.

The first and second discharge pipes 22 and 42 are connected to upper parts of the first and second trap tanks 16 and 36, respectively, to discharge photoresist from the first and second trap tanks 16 and 36. The first and second drain valves 20 and 40 are installed in the first and second discharge pipes 22 and 42. The valves 20 and 40 can each be switched between positions at which the photoresist solution is discharged from a tank 16, 36 through the discharge pipe 22, 42 connected thereto or the discharge is cut off.

The operation of the apparatus will be described, referring again to FIG. 1.

First, when the process is to be carried out using photoresist solution contained in the second photoresist bottle 30, a worker opens the second drain valve 40 and the second gas supply valve 31. At this time, the N2 purge gas is supplied through the second gas supply pipe 32, thereby pressurizing the second photoresist bottle 30. Accordingly, the photoresist solution is supplied to the second trap tank 36 through the second photoresist supply pipe 34 to fill the second trap tank 36 with the photoresist. Once the photoresist solution fills the trap tank 36, and the photoresist solution starts to discharge through the discharge pipe 42, the worker closes the second drain valve 40. Then, the photoresist solution in the trap tank 36 is supplied by a pump (not shown) to the nozzle 46 through the third supply pipe 44, whereby the photoresist solution is sprayed onto the wafer.

At some time during this deposition process the second level sensor 38 senses, via the level of photoresist in the tank 36, that the second photoresist bottle 30 is empty. When the second photoresist bottle 30 is detected as being empty, the worker opens the first drain valve 20 and the second gas supply valve 11. At this time, the N2 purge gas is supplied through the first gas supply pipe 12, thereby pressurizing first photoresist bottle 10. Accordingly, the photoresist solution in the first photoresist bottle 10 is supplied to the first trap tank 16 through the first photoresist supply pipe 14 to fill first trap tank 16. Once the first trap tank 16 is filled, and the photoresist solution starts to discharge through the discharge pipe 22, the worker turns off the first drain valve 20.

As described above, the conventional photoresist supply apparatus is operated by a worker. This operation can be wasteful because various amounts of the photoresist, determined by each worker, are discharged during the filling of the trap tanks 16 and 36.

Furthermore, the conventional photoresist supply apparatus may cause a process defect when one of the level sensors malfunctions. In this case, an empty state of a photoresist bottle is not sensed once the photoresist in a trap tank is exhausted. Accordingly, the operation is not switched over to use the photoresist contained in the other photoresist bottle, nor is the empty bottle exchanged.

SUMMARY OF THE INVENTION

Accordingly, an object of the present invention is to provide a photoresist supply apparatus capable of preventing an unnecessary consumption of photoresist when an essentially empty photoresist bottle is replaced with a new bottle.

Likewise, another object of the present invention is to provide a method of controlling the operation of a photoresist supply apparatus in a manner that prevents unnecessary consumption of photoresist when an essentially empty photoresist bottle is replaced with a new bottle.

Another object of the present invention is to provide a photoresist supply apparatus that prevents process defects from occurring in the coating operation.

Similarly, another object of the present invention is to provide a method of controlling the operation of a photoresist supply apparatus in a manner that prevents process defects from occurring in the coating operation once a bottle of the photoresist solution becomes used up.

According to one aspect of the invention, a photoresist supply apparatus for use in semiconductor coating equipment includes first and second photoresist bottles, first and second gas supply pipes, first and second solenoid valves, first and second purge start buttons, first and second photoresist supply pipes, first and second trap tanks, a third photoresist supply pipe, a nozzle, first and second level sensors, third and fourth level sensors, first and second discharge pipes, third and fourth solenoid valves, first and second drain sensors, and a controller.

The first and second photoresist bottles store the same type of photoresist solution.

The first and second gas supply pipes are respectively connected to the first and second photoresist bottles to supply N2 purge gas thereto. The first and second solenoid valves are installed along the first and second gas supply pipes, respectively, to supply or cut off the N2 purge gas. The first and second purge start buttons generate a purge start key signal when the first and second photoresist bottles are replaced.

The first and second photoresist supply pipes are respectively connected to upper parts of the first and second photoresist bottles to supply photoresist solution from the bottles. On the other hand, the first and second trap tanks are connected to the first and second photoresist supply pipes to receive photoresist from the first and second photoresist bottles. The third photoresist supply pipe is connected to the first and second trap tanks. The nozzle is connected to the third photoresist supply pipe to spray the photoresist solution, supplied from the third supply pipe, onto a wafer or the like.

The first and second level sensors are installed at upper parts of the first and second trap tanks, respectively, so as to sense when the photoresist in the tanks falls below a first level. The third and fourth level sensors are installed at lower parts of the first and second trap tanks, respectively, so as to sense when the photoresist in the tanks falls below a second level lower than the first level.

The first and second discharge pipes are connected to upper parts of the first and second trap tanks, respectively, to allow photoresist to be discharged from the first and second trap tanks. The third and fourth solenoid valves are installed along the first and second discharge pipes, respectively. Each of the valves is switchable between respective positions at which the photoresist solution is discharged from a trap tank through a discharge pipe and the discharging thereof is cut off. The first and second drain sensors sense the discharging of photoresist solution through the discharge pipes.

According to another aspect of the invention, the controller is operatively connected to each purge start button so as to receive the purge start key signal therefrom. The controller is also operatively connected to the solenoid valves disposed in the gas supply and discharge pipes so as to control the valves when the purge start key signal is received.

In particular, the controller drives the first and third solenoid valves when the controller receives the purge start key signal from the first purge start button, and likewise drives the second and fourth solenoid valves when the controller receives the purge start key signal from the second purge start button.

According to another aspect of the invention, the controller is also operatively connected to the level sensors so as to receive signals therefrom indicative of the level of photoresist solution in the trap tanks.

According to another aspect of the invention, the controller generates an alarm when the controller receives signals from either of the first and second level sensors indicative of an empty state of a photoresist bottle. Still further, the controller generates an interlock when the controller receives signals from either of the third and fourth level sensors.

BRIEF DESCRIPTION OF THE DRAWINGS

The present invention will become more fully understood from the detailed description thereof made below with reference to the accompanying drawings, wherein.

DETAILED DESCRIPTION OF THE PREFERRED EMBODIMENTS

The present invention will now be described in detail with reference to FIGS. 2, 3A and 3B. For the sake of clarity, though, a detailed description of known functions and systems has been omitted.

Figure 1:
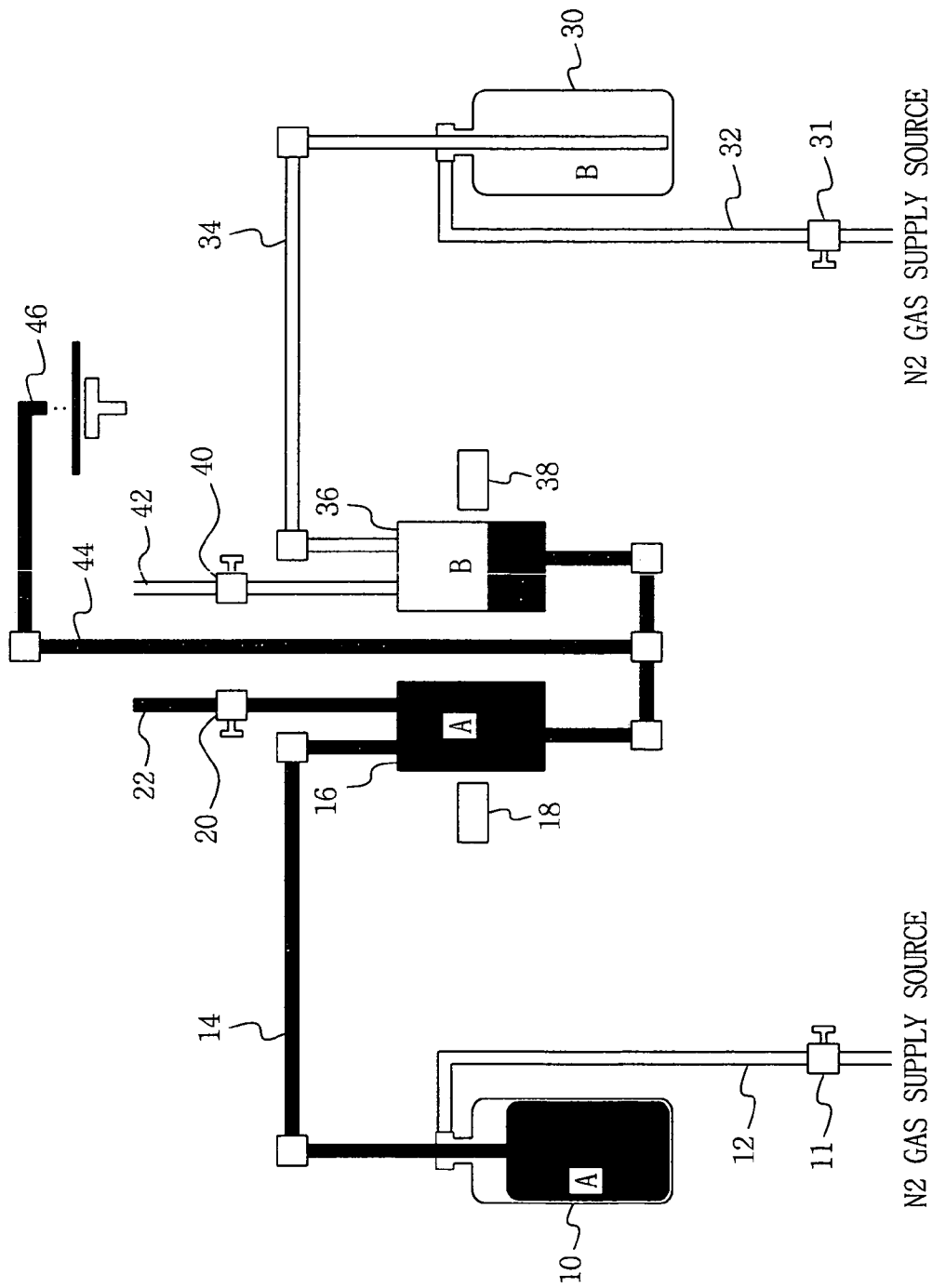
FIG. 1 is a schematic diagram of a photoresist supply apparatus according to the prior art.
Figure 2:
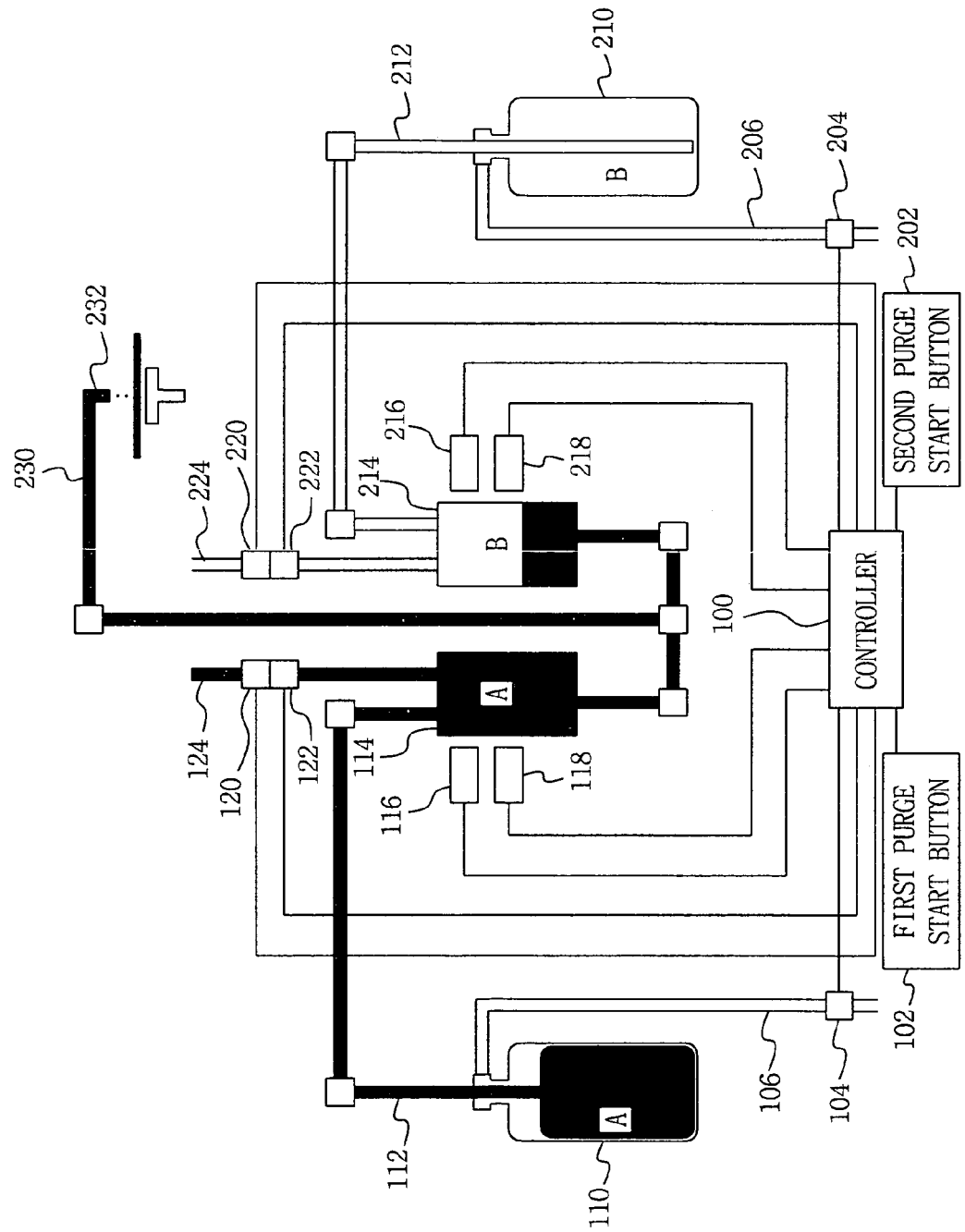
FIG. 2 is a schematic diagram of a photoresist supply apparatus for use in semiconductor coating equipment according to the present invention.

Referring first to FIG. 2, a photoresist supply apparatus for use in semiconductor coating equipment according to the present invention includes first and second photoresist bottles 110 and 210, first and second gas supply pipes 106 and 206, first and second solenoid valves 104 and 204, first and second purge start buttons 102 and 202, first and second photoresist supply pipes 112 and 212, first and second trap tanks 114 and 214, a third photoresist supply pipe 230, a nozzle 232, first and second level sensors 116 and 216, third and fourth level sensors 118 and 218, first and second discharge pipes 124 and 224, third and fourth solenoid valves 120 and 220, first and second drain sensors 122 and 222, and a controller 100.

The first and second photoresist bottles 110 and 210 store the same type of photoresist solution.

The first and second gas supply pipes 106 and 206 are connected to the first and second photoresist bottles 110 and 210, respectively, to supply N2 purge gas thereto. The first and second solenoid valves 104 and 204 are installed in the first and second gas supply pipes 106 and 206, respectively. The valves 104 and 204 can each be switched between respective positions at which the N2 purge gas is supplied to or cut off from the bottles 110, 210. The first and second purge start buttons 102 and 202 each generate a different purge start key signal when manipulated.

The first and second photoresist supply pipes 112 and 212 are connected to upper parts of the first and second photoresist bottles 110 and 210, respectively, to supply photoresist solution from the bottles. The first and second trap tanks 114 and 214 are each connected to a respective one of the first and second photoresist supply pipes 112 and 212 to receive photoresist supplied from the first and second photoresist bottles 110 and 210. The third photoresist supply pipe 230 is connected to both of the first and second trap tanks 114 and 214 to supply the photoresist from the first and second trap tanks 114 and 214 to the nozzle 232. The nozzle 232 sprays the photoresist, supplied through the third photoresist supply pipe 230, onto a wafer.

The first and second level sensors 116 and 216 are installed at upper parts of the first and second trap tanks 114 and 214, respectively. The third and fourth level sensors 118 and 218 are each installed at a lower part of the first and second trap tanks 114 and 214.

The first and second discharge pipes 124 and 224 are connected to upper parts of the first and second trap tanks 114 and 214, respectively, to discharge the first and second trap tanks 114 and 214. The third and fourth solenoid valves 120 and 220 are installed in the first and second discharge pipes 124 and 224, respectively. Each of the solenoid valves 120 and 220 can be switched between positions at which the photoresist solution is discharged through the discharge pipe 124, 224 or the discharging of the solution is cut off. The first and second drain sensors 122 and 222 sense whether photoresist solution is being discharged through the discharge pipes 124 and 224, respectively.

The controller 100 is connected to the first and second purge start buttons 102 and 202 to receive the purge start key signals, and drives the first and second solenoid valves 104 and 204 and the third and fourth solenoid valves 120 and 220. Also, the controller 100 is connected to an alarm (not shown), and to the first, second, third and fourth level sensors 116, 216, 118, and 218 so as to receive the signals generated by the sensors.

An operation in which a photoresist bottle is replaced will now be described.

First, assuming that the process is progressing using the photoresist solution contained in the second photoresist bottle 210, the controller 100 triggers an alarm when the photoresist in the second trap tank 214 is exhausted, i.e., when the second level sensor 216 senses that the trap tank 214 is empty. At this time, a worker perceives the alarm and manipulates the apparatus so that the photoresist is supplied from the first photoresist bottle 110. Then, the second photoresist bottle 210 is replaced with a new bottle and the second purge start button 202 is pressed.

As a result, the controller 100 opens the second solenoid valve 204 and the fourth solenoid valve 220. Subsequently, N2 purge gas is supplied to the second photoresist bottle 210 through the second gas supply pipe 206. Accordingly, the photoresist solution fills the second trap tank 214, and the photoresist solution in the tank 214 starts to discharge through the second discharge pipe 224. At this time, the second drain sensor 222 senses the discharging of the photoresist and issues a discharge sense signal to the controller 100. The controller 100 responds to this signal by closing the second and fourth solenoid valves 204, 220.

As mentioned above, during this process of supplying photoresist from the second photoresist bottle 210 to the nozzle 232, the controller 100 generates an alarm when the second level sensor 216 detects that the bottle 210 is empty. If the used photoresist bottle is not replaced, the photoresist in the trap tank 214 continues to be used and is exhausted. In this case, the empty state of the trap tank 214 is detected by the fourth level sensor 218. The controller 100 upon receiving a signal from the fourth level sensor 218 generates an interlock that acts to stop the process.

Needless to say, an operation similar to the above-described one occurs in the case of replacing the first photoresist bottle 110. Thus, a detailed description thereof will be omitted.

The control operations in which the photoresist bottles are replaced will now be described with respect to the flowcharts of FIGS. 3A and 3B.

Figure 3A:
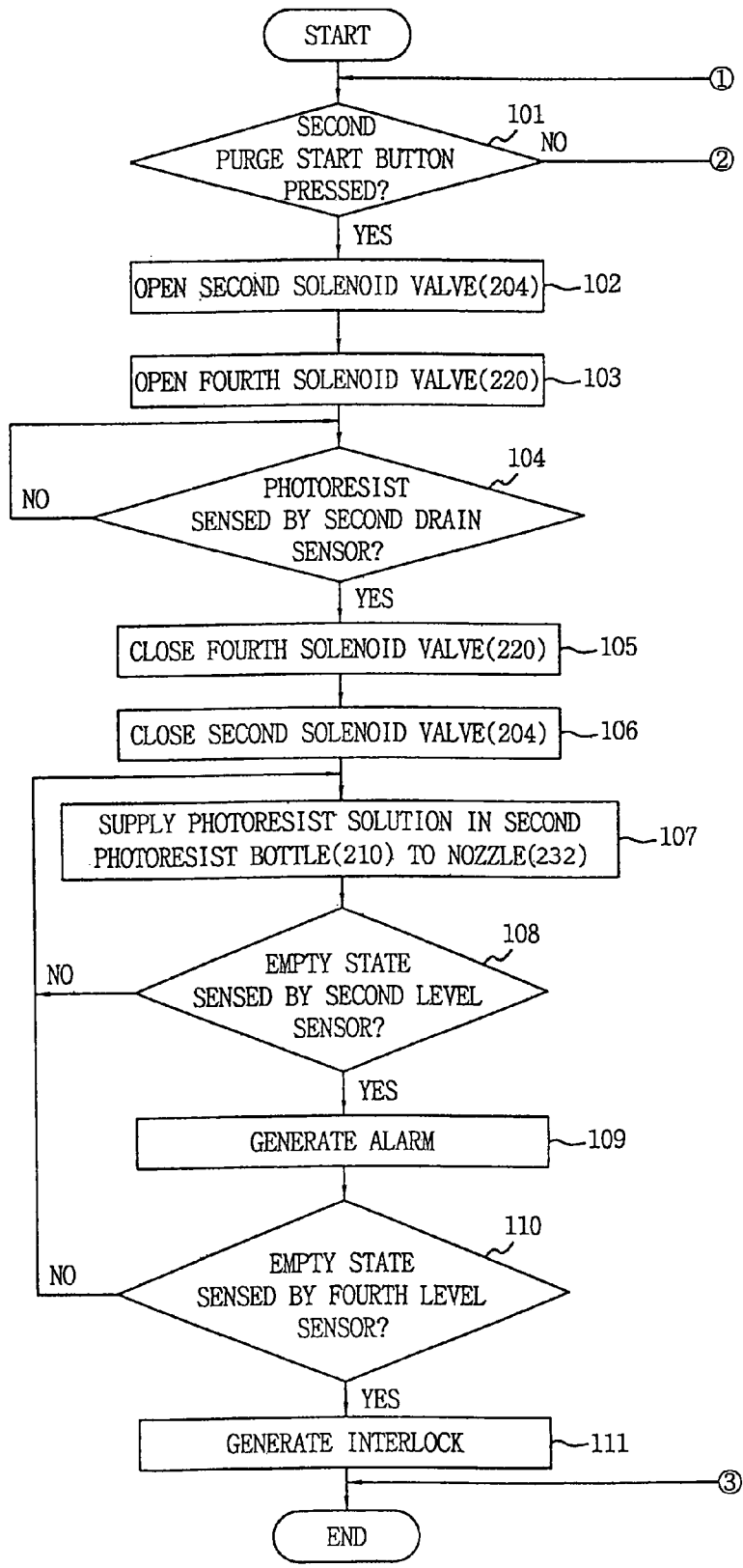
FIGS. 3A and 3B are each a flowchart illustrating an operation of the photoresist supply apparatus according to the invention.

The controller 100 constantly checks the apparatus to determine whether the second purge start button 202 is pressed (step 101 in FIG. 3A). Assuming that a worker has just replaced the second photoresist bottle 210 with a new one, the worker then presses the second purge start button 202. As a result, the controller 100 opens the second solenoid valve 204 (step 102), and the fourth solenoid valve 220 (step 103). Next, the controller 100 checks as to whether photoresist is sensed by the second drain sensor 222 (step 104), and if so, the controller 100 closes the fourth solenoid valve 220 (step 105) and the second solenoid valve 204 (step 106). Then the controller 100 controls the apparatus so that the photoresist solution is supplied to the nozzle 232 from the second photoresist bottle 210 and second trap tank 214 (step 107). During this time (step 108), the controller 100 checks as to whether the second level sensor 216 has sensed an empty state of the second trap tank. If so, the controller 100 triggers an alarm (step 109).

If the second photoresist bottle 210 is not replaced, the photoresist in the trap tank 214 continues to be used and is exhausted. The controller 100 checks (step 110) as to whether the fourth level sensor 218 has detected an empty state of the second trap tank 214. If so, the controller 100 generates an interlock that acts to stop the process (step 111).

Figure 3B:
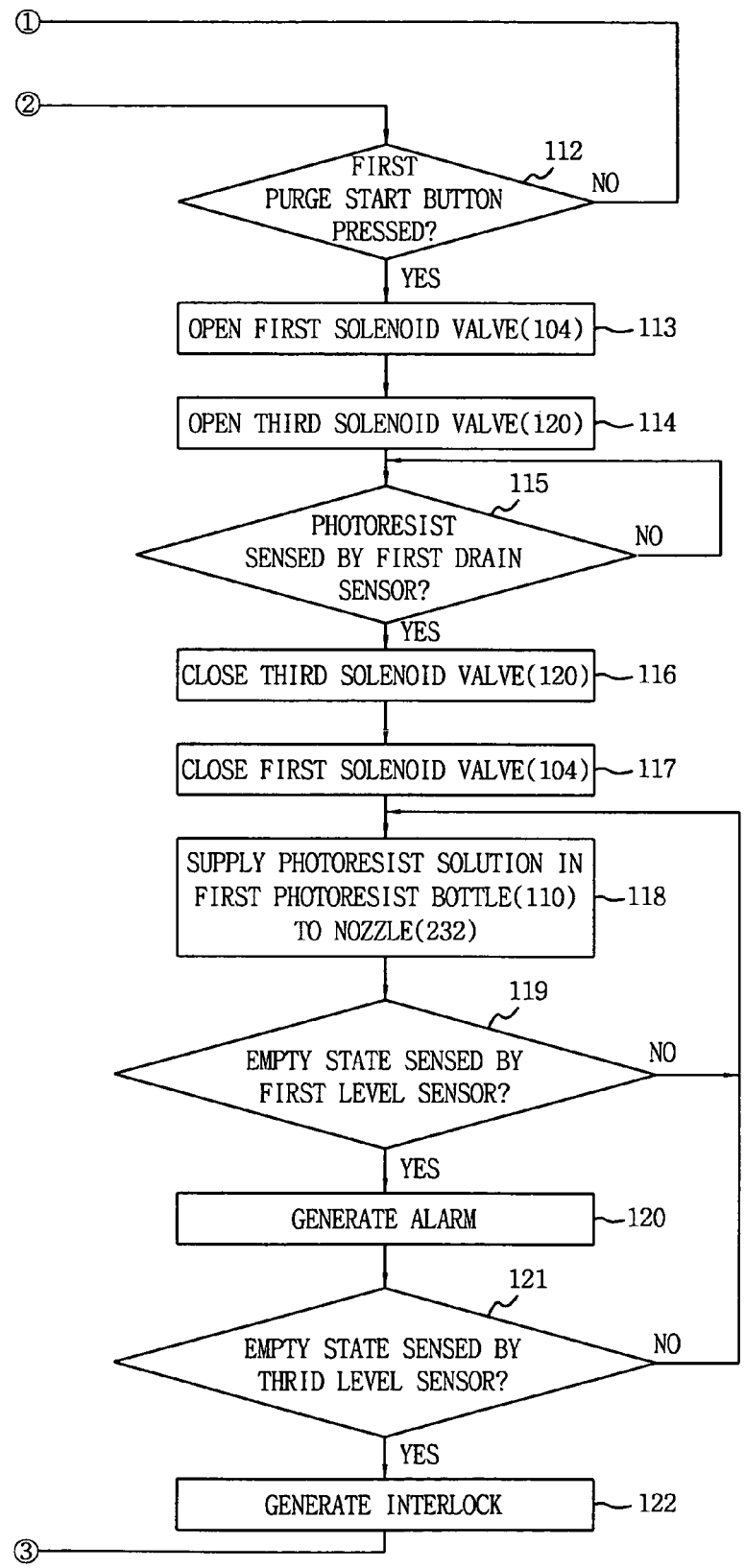

The controller 100 also constantly checks the apparatus to determine whether the first purge start button 102 has been pressed (step 112 in FIG. 3B). Assuming that a worker has just replaced the first photoresist bottle 110 with a new one, the worker then presses the first purge start button 102. As a result, the controller 100 opens the first solenoid valve 104 (step 113), and the third solenoid valve 120 (step 114). Next, the controller 100 checks as to whether photoresist is sensed by the first drain sensor 122, and if so, the controller 100 closes the third solenoid valve 120 (step 116) and the first solenoid valve 104 (step 117). Then the controller 100 controls the apparatus so that the photoresist solution is supplied to the nozzle 232 from the first photoresist bottle 110 and first trap tank 114 (step 118). During this time (step 119), the controller 100 checks as to whether the first level sensor 116 has sensed an empty state of the first trap tank. If so, the controller 100 triggers an alarm (step 120).

If the first photoresist bottle 110 is not replaced, the photoresist in the trap tank 114 continues to be used and is exhausted. The controller 100 checks (step 121) as to whether the third level sensor 118 has detected an empty state of the first trap tank 114. If so, the controller 100 generates an interlock that acts to stop the process (step 122).

As described above, according to the present invention, a photoresist supply apparatus is automatically set up when an empty photoresist bottle is replaced with a full one. In particular, photoresist is automatically purged once a purge start button has been pressed. Accordingly, photoresist is not wasted in the purge process, and manpower and costs can be saved. In addition, even a minimally skilled person can facilitate the purging of the photoresist.

Finally, although the present invention has been described above in connection with the preferred embodiments thereof, changes to and variations in the preferred embodiments will become apparent to those skilled in the art. Accordingly, these and other changes and variations are seen to be within the true spirit and scope of the invention as defined by the appended claims.

What is claimed is:

1. A photoresist supply apparatus for use in coating equipment, comprising:
    first and second bottles for use in storing solutions of photoresist;
    a source of $N_2$ gas;
    first and second gas supply pipes each connecting a respective one of the first and second bottles to said source of $N_2$ gas, whereby the $N_2$ gas is supplied to said bottle to purge the bottles;
    first and second solenoid valves disposed along the first and second gas supply pipes, respectively, said first and second solenoid valves each being switchable between respective positions at which the $N_2$ gas is supplied to and cut off from the bottle connected to the source of $N_2$ gas;
    first and second photoresist supply pipes connected to upper parts of the first and second bottles, respectively, to supply photoresist solution from the bottles;
    first and second trap tanks connected to the first and second photoresist supply pipes, respectively, to receive photoresist supplied from the first and second bottles;
    a third photoresist supply pipe connected to the first and second trap tanks;
    a nozzle connected to the third photoresist supply pipe so as to spray the photoresist solution supplied through the third photoresist supply pipe;
    first and second level sensors each operatively associated with an upper part of a respective one of the first and second trap tanks so as to sense when the photoresist solution in the tank falls below a first level;
    third and fourth level sensors each operatively associated with a lower part of a respective one of the first and second trap tanks so as to sense when the photoresist solution in the tank falls below a second level lower than said first level;
    first and second discharge pipes each connected to an upper part of a respective one of the first and second trap tanks so as to allow photoresist solution in the trap tanks to be discharged;
    third and fourth solenoid valves disposed along the first and second discharge pipes, each of said third and fourth solenoid valves being switchable between respective positions at which the photoresist solution is discharged from a said trap tank through a said discharge pipe and the discharging thereof is cut off;
    first and second drain sensors operatively associated with said discharge pipes, respectively, so as to sense whether photoresist solution is being discharged through the discharge pipes;
    first and second purge start buttons operative to generate a purge start key signal when manipulated; and
    a controller operatively connected to said first and second purge start buttons so as to receive the purge start key signals therefrom, operatively connected to said level sensors so as to receive signals therefrom indicative of the level of photoresist solution in said trap tanks, operatively connected to said drain sensors so as to receive signals therefrom indicative of whether photoresist solution is being discharged through the discharge pipes, and operatively connected to said solenoid valves so as to switch said valves between respective positions thereof based on said purge start key signals and the signals from said drain sensors.

2. The photoresist supply apparatus of claim 1, wherein the controller is configured to generate an alarm upon receiving a signal from the first or second level sensor, and is further configured to generate an interlock upon receiving a signal from the third or fourth level sensor.

3. A photoresist supply apparatus for use in coating equipment, comprising:
    a controller;
    first and second bottles adapted to store photoresist solution;
    first and second photoresist supply pipes respectively connected to upper parts of the first and second bottles and adapted to supply photoresist solution from the first and second bottles;
    first and second trap tanks respectively connected to the first and second photoresist supply pipes and adapted to receive photoresist supplied from the first and second bottles;
    first and second level sensors, each operatively associated with an upper part of a respective one of the first and second trap tanks, each adapted to sense when photoresist solution in the tank falls below a first level and further adapted to provide a first level signal to the controller;
    third and fourth level sensors, each operatively associated with a lower part of a respective one of the first and second trap tanks, each adapted to sense when photoresist solution in the tank falls below a second level lower than the first level and further adapted to provide a second level signal to the controller;
    first and second discharge pipes each connected to an upper part of a respective one of the first and second trap tanks and adapted to discharge photoresist solution from the first and second trap tanks respectively;
    a first drain sensor configured to sense discharge of the photoresist solution from the first trap tank through the first discharge pipe, and further configured to provide a first discharge sense signal to the controller;
    a second drain sensor configured to sense discharge of the photoresist solution from the second trap tank through the second discharge pipe, and further configured to provide a second discharge sense signal to the controller;

first and second purge start buttons configured to generate and provide the controller with first and second purge start key signals, respectively;

wherein the controller is configured to control the transfer of photoresist solution from the first bottle to the first trap tank upon receiving the first purge start key, and further configured to control the transfer of photoresist solution from the second bottle to the second trap tank upon receiving the second purge start key.

4. The photoresist supply apparatus of claim 3, wherein the controller is further configured to control a supply of $N_2$ gas from a source of $N_2$ gas to the first and second bottles through first and second gas supply pipes, respectively.

5. The photoresist supply apparatus of claim 4, further comprising:

first and second solenoid valves respectively disposed along the first and second discharge pipes;

wherein each one of the first and second solenoid valves is switchable between first and second positions, the first position allowing discharge of photoresist solution from a respective one of the first and second trap tanks through the respective one of the first and second discharge pipes, the second position cutting off discharge of the photoresist solution.

6. The photoresist supply apparatus of claim 5, wherein the controller is further configured to switch the first and second solenoid valves in response to the first and second purge start key signals, respectively, and in response to the first and second discharge sense signals.

7. The photoresist supply apparatus of claim 6, further comprising:

a third photoresist supply pipe connected to the first and second trap tanks; and, a nozzle connected to the third photoresist supply pipe and configured to spray photoresist solution.

8. The photoresist supply apparatus of claim 7, wherein the controller is further configured to generate an alarm upon receiving the first level signal, and to generate an interlock upon receiving the second level signal.

9. A photoresist supply apparatus for use in coating equipment, comprising:

a controller;

a bottle adapted to store photoresist solution;

a trap tank adapted to receive photoresist solution from the bottle through a photoresist supply pipe;

a discharge pipe connected to the trap tank and adapted to discharge photoresist solution from the trap tank;

a drain sensor operatively associated with the discharge pipe and adapted to provide a discharge sense signal to the controller when photoresist solution is discharged from the trap tank;

a purge start button configured to generate a purge start key signal and provide the purge start key signal to the controller;

wherein the controller is configured to control the transfer of photoresist solution from the bottle to the trap tank in response to the purge start key;

a first level sensor operatively associated with the trap tank to provide a first level signal to the controller upon sensing that the photoresist solution in the tank has fallen below a first level; and, a second level sensor operatively associated with the trap tank to provide a second level signal to the controller upon sensing that the photoresist solution in the tank falls below a second level lower than the first level.

10. The photoresist supply apparatus of claim 9, wherein the controller is further configured to control a supply of $N_2$ gas from a source of $N_2$ gas to the bottle through a gas supply pipe connecting the bottle to the source of $N_2$ gas.

11. The photoresist supply apparatus of claim 10, further comprising:

a first solenoid valve disposed along the gas supply pipe, wherein the first solenoid valve is switchable between respective positions allowing or cutting off the supply of $N_2$ gas to the bottle; and, a second solenoid valve disposed along the discharge pipe, wherein the second solenoid valve is switchable between respective positions allowing or cutting off discharge of the photoresist solution from the trap tank.

12. The photoresist supply apparatus of claim 11, wherein the controller is further configured to switch the first and second solenoid valves in response to the purge start key signal and the discharge sense signal.

13. The photoresist supply apparatus of claim 12, further comprising:

a second photoresist supply pipe connected to the trap tank; and, a nozzle connected to the second photoresist supply pipe and configured to spray photoresist solution.

14. The photoresist supply apparatus of claim 13, wherein the controller is configured to generate an alarm upon receiving the first level signal, and generate an interlock upon receiving the second level signal.

* * * * *